(12) United States Patent
Labbe

(10) Patent No.: US 9,645,175 B2
(45) Date of Patent: May 9, 2017

(54) ELECTRICAL CURRENT TRANSDUCER WITH GROUNDING DEVICE

(71) Applicant: LEM INTELLECTUAL PROPERTY SA, Fribourg (CH)

(72) Inventor: Arnaud Labbe, St-Girod (FR)

(73) Assignee: LEM Intellectual Property SA, Fribourg (CH)

(*) Notice: Subject to any disclaimer, the term of this patent is extended or adjusted under 35 U.S.C. 154(b) by 0 days.

(21) Appl. No.: 14/649,915

(22) PCT Filed: Dec. 4, 2013

(86) PCT No.: PCT/IB2013/060640
§ 371 (c)(1),
(2) Date: Jun. 4, 2015

(87) PCT Pub. No.: WO2014/087349
PCT Pub. Date: Jun. 12, 2014

(65) Prior Publication Data
US 2015/0309082 A1    Oct. 29, 2015

(30) Foreign Application Priority Data

Dec. 7, 2012    (EP) .................................... 12196186

(51) Int. Cl.
*G01R 15/18*    (2006.01)
*G01R 15/20*    (2006.01)
(Continued)

(52) U.S. Cl.
CPC ......... *G01R 15/202* (2013.01); *G01R 15/207* (2013.01); *G01R 33/0052* (2013.01);
(Continued)

(58) Field of Classification Search
CPC ............. H01L 41/0206; H01F 41/0233; Y10T 29/4902; Y10T 29/49069; Y10T 29/49071;
(Continued)

(56) References Cited

U.S. PATENT DOCUMENTS 5,331,304 A    7/1994  White et al.
5,552,700 A    9/1996  Tanabe et al.
(Continued)

FOREIGN PATENT DOCUMENTS

EP    2073025 A1    6/2009
EP    2224461 A1    9/2010
(Continued)

OTHER PUBLICATIONS

International Search Report and Written Opinion issued by the European Patent Office, dated Feb. 25, 2014, for related International Application No. PCT/IB2013/060640; 11 pages.

*Primary Examiner* — Patrick Assouad
*Assistant Examiner* — Demetrius Pretlow
(74) *Attorney, Agent, or Firm* — Faegre Baker Daniels LLP

(57)    ABSTRACT

An electrical current transducer including a housing (5), a magnetic field detector device (3) comprising a magnetic field detector (11), and a magnetic circuit (2) comprising a magnetic core (4) with a gap (6) and a grounding device (8) mounted on the magnetic core. The magnetic field detector is positioned in the gap (6). The grounding device comprises at least two parts (8a, 8b), a first part (8a) mounted against a first lateral side (14a) of the magnetic core and a second part (8b) mounted against a second lateral side (14b) of the magnetic core opposite the first lateral side. At least one of the first and second parts comprises clamp fixing extensions (30a, 30b) cooperating with the other of the first and second (Continued)

parts configured for clamping together the first and second parts around a portion of the magnetic core. The least one of the first and second parts comprising electrically conductive material, said part comprising at least one contact terminal (34*a*, 34*b*) being adapted to provide an electrical grounding connection for grounding the magnetic core.

30 Claims, 2 Drawing Sheets

(51) Int. Cl.
  *H01F 3/04* (2006.01)
  *H01F 3/14* (2006.01)
  *G01R 33/00* (2006.01)
  *H01F 41/02* (2006.01)

(52) U.S. Cl.
  CPC ............... *H01F 3/04* (2013.01); *H01F 3/14* (2013.01); *H01F 41/0213* (2013.01)

(58) Field of Classification Search
  CPC ........ Y10T 29/49073; Y10T 29/49075; G01R 1/20; G01R 1/22; G01R 11/06; G01R 19/20; G01R 33/0283
  USPC ............................ 324/117 H, 117 R; 29/602.1
  See application file for complete search history.

(56) References Cited

U.S. PATENT DOCUMENTS

| | | | |
|---|---|---|---|
| 6,348,800 B1 * | 2/2002 | Haensgen | G01R 31/024 324/117 H |
| 6,351,116 B1 * | 2/2002 | Bolda | G01R 35/005 324/202 |
| 6,426,617 B1 | 7/2002 | Haensgen et al. | |
| 2010/0259248 A1 * | 10/2010 | Labbe | G01R 15/207 324/151 R |
| 2010/0265027 A1 * | 10/2010 | Demolis | H01F 3/04 336/213 |

FOREIGN PATENT DOCUMENTS

| | | |
|---|---|---|
| JP | H07260829 A | 10/1995 |
| JP | 2008070173 A | 3/2008 |
| JP | 4250365 B2 | 4/2009 |
| WO | 2009151011 A1 | 12/2009 |

* cited by examiner

ELECTRICAL CURRENT TRANSDUCER WITH GROUNDING DEVICE

BACKGROUND

The present invention relates to an electrical current transducer comprising a magnetic circuit with a magnetic core having a gap. The present invention is in particular related to an electrical current transducer with a wound magnetic core and a grounding device.

Many conventional current transducers comprise a magnetic core made of material with a high magnetic permeability and a magnetic field sensor, such as a Hall effect sensor, positioned in a gap formed in the magnetic core. A primary conductor extending through a central passage of the magnetic circuit generates a magnetic field that is picked-up by the magnetic core. The magnetic field flows across the gap and the magnetic field detector positioned therein. Since the gap represents a zone of low magnetic permeability and thus has an important effect on the magnetic field lines, it is important to accurately control the width of the gap in order to ensure accurate and reliable measurement of the electrical current to be measured.

It is also important to reduce losses in the transducer, in particular losses due to the formation of eddy currents in the magnetic core and to avoid magnetic saturation along any section of the magnetic core. The use of stacked laminated sheets to reduce eddy currents is well-known. A known means of forming a stacked multilayer magnetic circuit is by winding a thin band or strip of magnetic material to form an annular wound core. It is known to provide wound cores with air gaps, whereby the manufacturing process consists of first winding an annular toroidal core, subsequently applying resin to the core to hold the concentric layers of strip material and subsequently machining a gap radially through a section of the winding. Once the resin has been applied, annealing of the material of the wound magnetic core is difficult or no longer possible in view of the high temperatures required for the annealing process.

Working of materials with high magnetic permeabilities can affect their magnetic properties, in particular by reducing their magnetic permeability and thus adversely affecting the magnetic performance of the magnetic circuit.

To avoid electrical discharge and ensure an accurate measurement of the current flowing in the primary conductor, the magnetic core is often connected to ground. Typically this is done by soldering or even welding an electrical conductor, which is configured to be connected to ground, to the magnetic core. The ground connection may also be achieved by positioning an electrical conductor plate in contact with the magnetic core without changing the structure of the magnetic core. A method of connecting a magnetic core to ground without changing the structure of the magnetic core is for instance shown in JP 4250365, in which a grounding element, such as a circuit board, is positioned against a surface of the magnetic core to produce a capacitive coupling between the magnetic core and the grounding element. A drawback of this design is that the grounding element is not held in position in relation to the magnetic core and thus the connection between the grounding element and the magnetic core is not stable and not very resistant in harsh environments. Another disadvantage concerns the various parts that are present during the assembly, and the fragility of such a construction.

The gap length of a magnetic circuit may vary due to thermal and mechanical forces. It is known to stabilize the size of the gap by means of an element fixed to the magnetic core. In JP 2 601 297 the air gap of an annular wound magnetic core is fixed by means of a T-shaped element having a portion partially inserted in the air gap from the outer radial side of the magnetic circuit, the insert being held in place by means of a band wound around the magnetic circuit and the insert. A drawback of this design is that the insert partially engages in the air gap and thus limits the space for insertion of a magnetic field sensor. Moreover, the insert only engages the outer peripheral layers of the magnetic circuit and thus does not prevent variation of the size of the air gap of the inner radial layers of the magnetic circuit, in particular variations due to thermal forces that the resin binding the layers cannot entirely prevent. Also, heat treatment of the magnetic circuit after application of the resin is either not possible or at best limited. The position of the insert from the outer radial periphery of the magnetic circuit also increases the size of the magnetic circuit.

In EP2224461, a magnetic circuit with a wound core and a bridging element welded on a lateral side of the core and spanning across the air gap, is disclosed. This offers a compact configuration with stable fixing of the air gap. The welded connection between the bridging element and the magnetic core may be used for grounding the magnetic core via the bridging element and fixing pins thereof, however the welded connection between the bridging element and the magnetic core may reduce the magnetic permeability of the magnetic core in the welding zone. Moreover, in particularly harsh environments, such as those found in automotive applications, the weld connections subjected to thermal and mechanical shock as well as a corrosive environment may deteriorate over time.

SUMMARY OF THE DISCLOSURE

It is an object of this invention to provide an electrical current transducer having a magnetic circuit with a gap, that is robust and economical to manufacture, especially in large series manufacturing, yet ensures accurate and reliable performance even when subjected to harsh operating environments.

It would be advantageous to provide an electrical current transducer that is compact and easy to assemble.

It would be advantageous to provide an electrical current transducer having a magnetic core that has uniform magnetic material properties, in particular a high and uniform magnetic permeability.

It is an object of this invention to provide a process for manufacturing a magnetic circuit for an electrical current transducer, that is economical and results in a magnetic core that performs accurately and reliably for current sensing applications, and that is robust and resistant to thermal and mechanical stresses.

It would be advantageous to provide a magnetic circuit with wound magnetic core that enables easy and versatile assembly of the various components of a current transducer.

Objects of this invention have been achieved by providing an electrical current transducer according to claim 1.

Disclosed herein is an electrical current transducer including a housing, a magnetic field detector device comprising a magnetic field detector, and a magnetic circuit comprising a magnetic core with a gap. A grounding device is mounted on the magnetic core, the magnetic field detector being positioned in the gap. The grounding device comprises at least two parts, a first part mounted against a first lateral side of the magnetic core and a second part mounted against a second lateral side of the magnetic core opposite the first lateral side. At least one of the first and second parts comprises clamp fixing extensions cooperating with the other of the first and second parts configured for clamping together the first and second parts around a portion of the magnetic core. At least one of the first and second parts comprises electrically conductive material, said part comprising at least one contact terminal being adapted to provide an electrical grounding connection for grounding the magnetic core.

In an advantageous embodiment, the capacitive coupling between the grounding device and the magnetic core is greater than the capacitive coupling between the magnetic field detector and the magnetic core.

The magnetic core may in particular be in the form of a wound magnetic core comprising a plurality of stacked concentric ring layers of magnetic material.

At least the first part may be essentially planar configured for abutting or being in contact with the first lateral side of the magnetic core.

In an advantageous embodiment the first part may comprise a central passage configured to receive a primary conductor and it may be made of electrically conductive material, being adapted to be more or less congruent with a surface defined by the first lateral side of the magnetic core, configured to provide a capacitive coupling between the magnetic core and the grounding device.

In an advantageous embodiment the first part may comprise clamp extension cavities receiving there through free ends of clamp fixing extensions of the second part, the free ends being crimped.

The second part may comprise a first element and a second element, the first and second elements may comprise electrically conductive material.

In an embodiment the first and second element each may comprise a connecting portion, the at least two radially outer clamp fixing extensions may be positioned against an outermost ring layer of the magnetic core, the connecting portion may be configured to interconnect the at least two radially outer fixing extensions.

The at least one of the first and second elements may comprise the contact terminal.

The contact terminal may be configured to be connected to a grounding terminal, for example provided on a printed circuit board or a connector device.

In an advantageous embodiment the first part may comprise a gap-positioning element made of a non-magnetic material inserted in the gap configured to determine a minimum width of the gap.

The gap-positioning element may extend from a radially innermost layer to a radially outermost layer of the magnetic core.

The grounding device may further comprise housing fixing portions in the form of tabs or pins interfering with corresponding wall portions formed in a housing base part of the housing configured to lock the magnetic circuit securely within the housing base part during assembly.

The first part may be made of a single piece non-magnetic die stamped metal sheet part.

The second part may be stamped out of or made of a non-magnetic metal sheet.

In advantageous embodiment the space between the radially outer fixing extensions may be configured to enable insertion of the magnetic field detector in the gap.

A method of making a magnetic circuit of an electrical current transducer according to the invention includes the steps of:
  winding a magnetically permeable strip material to form a stacked multilayer ring core;
  machining a gap through a section of the stacked multilayer ring core;
  mounting the first and second parts of the bridging device around the magnetic core such that the fixing extensions of the second part are inserted through the corresponding clamp extension receiving cavities of the first part;
  crimping the ends of the fixing extensions such that the two parts are clamped together tightly against opposite lateral sides of the wound magnetic core.

After the assembly of the grounding device, the magnetic circuit is heat treated for annealing the magnetic material of the core.

BRIEF DESCRIPTION OF THE DRAWINGS

Further objects and advantageous features of the invention will be apparent from the claims and the following detailed description of an embodiment in conjunction with the annexed figures in which:

DETAILED DESCRIPTION

Figure 1A:
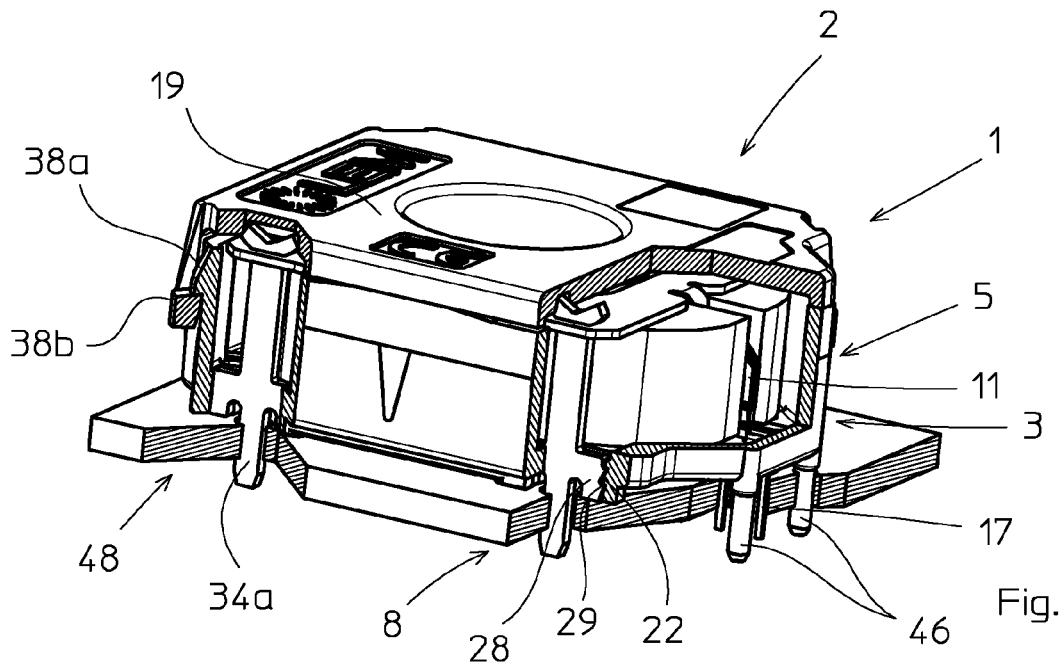
FIG. 1a is a view in perspective with partial cut aways of an electrical current transducer according to an embodiment of this invention mounted on a circuit board.

Referring to the figures, an electrical current transducer 1 comprises a magnetic circuit 2, a magnetic field sensing device 3, and a housing 5, the magnetic circuit and magnetic field detector being mounted in the housing. The housing 5 comprises a base part 5a and a cover part 5b that closes the base part 5a once the magnetic circuit and field detector are mounted in the housing base part 5a.

The magnetic circuit 2 comprises an annular magnetic core 4 with a gap 6 (also commonly known as an "air-gap" even though it may not be filled with air) and a grounding device 8 attached to the magnetic core 4. The gap 6 is formed between opposed end faces 12 of the magnetic core 4. In a preferred embodiment the magnetic core 4 is made of a wound strip of thin sheet material with a high magnetic permeability so as to form stacked concentric ring layers, from a radially innermost layer 16 to a radially outermost ring layer 18. Magnetic materials with high magnetic permeability are known and for instance include FeSi or FeNi alloys. The thin edges of the strip layer define opposed lateral sides 14a, 14b of the magnetic core. The lateral sides 14a, 14b define a surface 42a, 42b and are arranged in planes that are orthogonal to an axial direction A that extends through a central passage 9 of the current transducer, the central passage 9 being configured for receiving one or more primary conductors carrying the electrical current or currents to be measured.

The magnetic material strip from which the core is wound has a width W that is preferably of the same order of magnitude as the radial distance R between the innermost and outermost layers 16, 18. The ratio of width to radial thickness W/R is preferably in the range of 0.3 to 3, more preferably in the range of 0.5 to 2.

The grounding device 8 is made of a non-magnetic material. The grounding device 8 comprises at least partially an electrically conductive material and serves to provide an electrical grounding connection between the magnetic core 4 and a ground connection to an electrical ground terminal, provided on a circuit board or a connector device, for example.

Figure 1B:
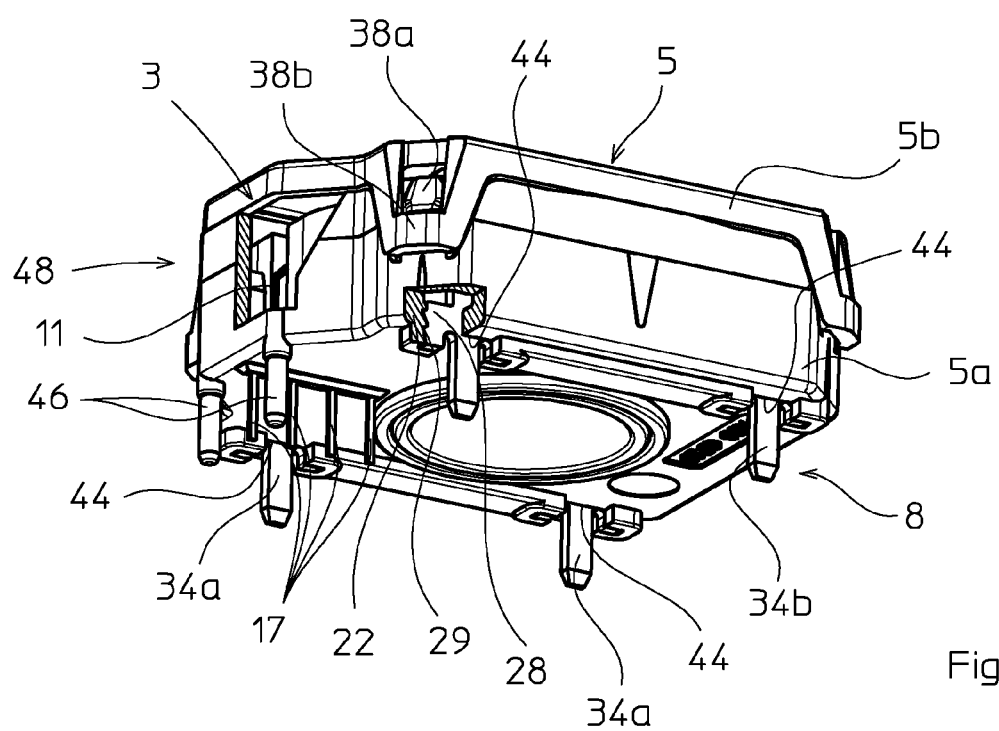
FIG. 1b is another view in perspective with partial cut aways of the embodiment according to FIG. 1a (without circuit board)

The grounding device 8 may advantageously comprise housing positioning and fixing portions 28 for instance in the form of tabs or pins with barbs 29 that are inserted into corresponding cavities or interfere with corresponding wall portions 22 (c.f. FIGS. 1*a* and 1*b*) formed in the housing base part 5*a*. This allows fixing the magnetic circuit 2 formed of the assembled magnetic core 4 and grounding device 8 securely within the housing base part 5*a* during assembly. The housing base part 5*a* comprises a magnetic core receiving cavity portion 19 with positioning elements such as positioning ribs or protrusions (not visible) to receive and position the magnetic core 4 within the cavity portion 19 in conjunction with the housing positioning and fixing portions 28 of the grounding device 8 that lock the magnetic circuit 2 in the housing.

The first and second parts 8*a*, 8*b* are assembled against the opposing outer lateral sides 14*a*, 14*b* of the magnetic core 4 whereby free ends 32*a*, 32*b* of clamp fixing extensions 30*a*, 30*b* arranged on the second part 8*b*, are inserted through corresponding cavities 27 of the first part 8*a*. The free ends 32*a*, 32*b* are permanently deformed by a crimping operation configured to draw the two parts tightly towards each other to effect a stable and rigid clamping of the grounding device 8 against the lateral sides 14*a*, 14*b* of the magnetic core 4. The clamping effect also ensures that the ring layers of the magnetic core do not shift laterally with respect to each other and form planar lateral surfaces 14*a*, 14*b*. The clamping effect further ensures a good electrical connection between the magnetic core 4 and the grounding device 8.

In the embodiment shown, the first part 8*a* and the second part 8*b* may be made of or comprise electrically conductive material. The first part 8*a* may be essentially planar so that it abuts the surface 42*a* defined by the first lateral side 14*a* of the magnetic core 4. The first part 8*a* and partially the second part 8*b* are thus configured to capacitively connect the magnetic core 4 to the grounding device 8 and thus grounding the magnetic core 4. The first part 8*a* is further designed so that the capacity (C1) between the grounding device 8 and the magnetic core 4 is greater than the capacity (C2) between the magnetic core and the magnetic field detector 11. The first part 8*a* comprises a central passage 9 configured to receive the one or more primary conductors.

Advantageously the first part 8*a* may be more or less congruent with the surface 42*a* defined by the first lateral side 14*a*.

In an embodiment, the first part 8*a* may cover as much as 70-100% of the surface 42*a* defined by the first lateral side 14*a*, preferably more than 85% to ensure a high capacitive coupling therebetween.

Figure 2B:
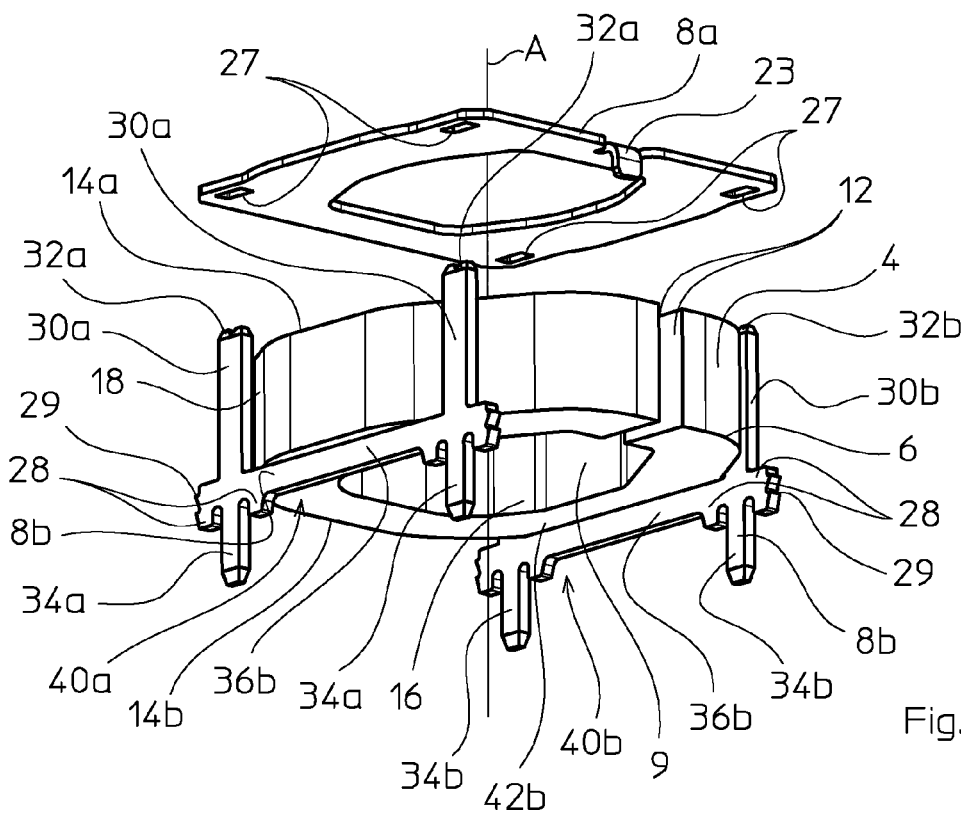
FIG. 2b is a view in perspective of a magnetic core and a grounding device assembled together.
Figure 2A:
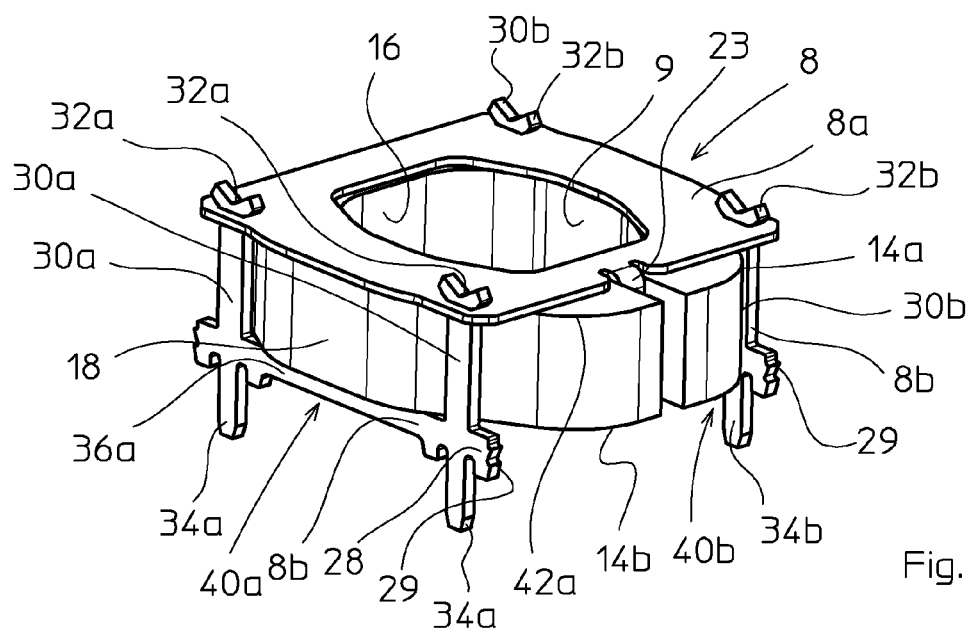
FIG. 2a is a view in perspective of a magnetic core and a grounding device in the process of being assembled together.

The second part 8*b* may comprise a first element 40*a* and a second element 40*b*, for instance as illustrated in FIGS. 2*a* and 2*b*. The first and second elements 40*a*, 40*b* comprise each housing positioning and fixing portions 28 with barbs 29.

The first and second elements 40*a*, 40*b* further comprise the clamp fixing extensions 30*a*, 30*b* and contact terminals 34*a*, 34*b* configured to be electrically connected to an external electrical ground connection. The contact terminals may be in the form of tabs or pins for insertion into conductive holes in a circuit board or for plugging to an electrical connector to connect the magnetic core 4 to ground. The contact terminals may also have other shapes and configurations for solder or plugging connection to an external electrical ground conductor. The contact terminals 34*a*, 34*b* extend in a direction opposite the fixing extensions 30*a*, 30*b*. The two contact terminals 34*a* and the two clamp fixing extensions 30*a* of one of the first and second elements 40*a*, 40*b* are interconnected by a connecting portion 36*a*, 36*b*. The number and spatial arrangement of clamp fixing extensions 30*a*, 30*b* and contact terminals 34*a*, 34*b* on one element 40*a*, 40*b* may vary according to the needs and chosen configuration. Further, the amount of contact terminals 34*a*, 34*b* and clamp fixing extensions 30*a*, 30*b* of one of the first and second elements 40*a*, 40*b* may differ, thus the first element 40*a* may for example comprise two contact terminals 34*a* and three clamp fixing extensions 30*a*.

The contact terminals 34*a*, 34*b* have a slightly tapered tip at their free end to facilitate insertion in a complementary receptacle or hole.

The contact terminals 34*a*, 34*b* may also advantageously serve as mechanical anchors to stably and rigidly fix the transducer to a circuit board or other support on which the transducer is intended to be mounted.

The clamp fixing extensions 34*a*, 34*b* are arranged on a radially outer side of the magnetic core 4 around a periphery of the magnetic core 4, preferably in contact with the radially outermost layer 18 of the wound magnetic core 4. Advantageously the clamp fixing extensions 34*a*, 34*b* are positioned uniformly, in a constant distance around the periphery of the magnetic core 4. A region around the gap 6 of the magnetic core 4 is kept more or less free from the grounding device 8 and the first and second part, respectively; said region being arranged in proximity to the lateral outermost layer 18.

In the embodiment shown in the figures, the first part 8*a* and the second part 8*b* may comprise electrically conductive material so that the magnetic core 4 may be grounded. The first and second part 8*a*, 8*b* are in a preferred embodiment completely made of electrically conductive material, in particular of non-magnetic sheet metal, but within the scope of the invention it is also possible that the first part 8*a* and/or the second part 8*b* may comprise electrically conductive tracks or conductive layers to transport an electric charge.

In an alternative embodiment the contact terminals 34*a*, 34*b* may be arranged on the first part 8*a*. In such an embodiment the second part 8*b* may not necessarily comprise electrically conductive material or being made of electrically conductive material.

The first and second element 40*a*, 40*b* may be interconnected by one or more elements to form a stable unit.

The housing base part 5*a* comprises contact terminal receiving orifices 44 configured to let the contact terminals 34*a*, 34*b* pass through and extend beyond the base part 5*a* so that they may engage in terminals of a circuit board or other type of female connector device (not shown). The housing base part 5*a* further comprises positioning elements 46 for positioning the housing 5 comprising the magnetic circuit 2 and the grounding device 8 on the circuit board or other device (not shown). The cover part 5*b* of the housing 5 may be connected to the housing base part 5*a* via complementary engaging portions 38*b* which engage, for example via a snapping mechanism, engaging portions 38*a* arranged on the housing base part 5*a*. The magnetic field detector device 3 may comprise a signal processing circuit (not visible), which may be connected to terminals 17 extending through orifices in the base part 5*a* of the housing and configured to be connected to a circuit board or other device.

Referring to all figures, the grounding device 8 allows access to the gap 6 for positioning of a magnetic field detector 11 of the magnetic field sensing device 3 in the gap 6. The grounding element 8 may comprise a gap-positioning element 23 inserted within the gap from one of the lateral sides 14a, 14b, in FIG. 2a for instance from the lateral side 14a, of the magnetic core and spanning between end faces 12 of the magnetic core. The gap-positioning element may be arranged or integrally formed on the first part 8a of the grounding device 8. The gap-positioning element is configured to adjust the width of the gap 6 and in particular to set the minimum width of the gap. The gap-positioning element may advantageously extend from the radially innermost layer 16 to the radially outer layer 18 to ensure that the ring layers do not shift relative to each other, and to ensure a constant gap width from the radially inner side to the radially outer side. The gap-positioning element may advantageously be in a form of an essentially planar portion of non magnetic sheet material that is positioned essentially flush with the lateral outer side 14a of the magnetic core thus consuming very little of the cross sectional surface area of the gap 6.

The magnetic field detector 11 may be for instance in the form of a Hall effect sensor, connected to a signal processing circuit comprising a circuit board 48 on which the magnetic field detector 11 is mounted.

The manufacturing process of the coil described herein includes an operation of winding a strip (band) of high magnetic permeability material, by conventional means for producing wound magnetic cores, and holding the ends of the strip with a spot weld, or alternatively an adhesive. The gap 6 is machined through a section of the stacked layers of the magnetic core. Subsequently, the grounding device parts 8a, 8b are mounted around the magnetic core 4 such that the fixing extensions 30a, 30b of the second part 8b are inserted through the corresponding cavities 27 of the first part 8a. The ends 32a, 32b of the fixing extensions 30a, 30b are then permanently deformed in a crimping operation by a Y shaped anvil such that the two parts 8a, 8b clamped together tightly against opposite lateral sides 14a, 14b of the wound magnetic core. This leads to a very robust assembly.

After the assembly of the grounding device, the magnetic circuit may pass through a heat treatment process for annealing the magnetic material of the core in order to provide it with uniform magnetic properties, in particular uniform high magnetic permeability. This removes or reduces the adverse effects on magnetic properties of the strip material resulting from the preceding manufacturing operations. The heat treatment process also has the advantageous effect of reducing internal stresses in the magnetic core material.

After the heat treatment process, the magnetic circuit 2 and the grounding device 8 can be assembled within the housing 5. The housing 5, magnetic circuit 2 and grounding device 8 form thereby a semi-finished unit. The semi-finished unit is thus configured to be very stable and robust.

The invention claimed is:

1. Electrical current transducer including a housing, a magnetic field detector device comprising a magnetic field detector, and a magnetic circuit comprising a wound magnetic core with a gap and a grounding device mounted on the magnetic core, the wound magnetic core comprising a plurality of stacked concentric ring layers from a radially innermost layer to a radially outermost layer of magnetic material, the magnetic field detector being positioned in the gap, wherein the grounding device comprises at least two separate parts made of a non-magnetic material, a first part mounted against a first lateral side of the magnetic core and a second part) mounted against a second lateral side of the magnetic core opposite the first lateral side, at least one of the first and second parts comprising clamp fixing extensions cooperating with the other of the first and second parts configured for clamping together the first and second parts around a portion of the magnetic core whereby free ends of clamp fixing extensions arranged on the second part are inserted through corresponding cavities of the first part and wherein at least one of the first and second parts comprises electrically conductive material, said part comprising at least one contact terminal being adapted to provide an electrical grounding connection for grounding the magnetic core to an external ground conductor.

2. Electrical current transducer according to claim 1, wherein at least the first part is essentially planar configured for abutting on the first lateral side.

3. Electrical current transducer including a housing, a magnetic field detector comprising a magnetic field detector, and a magnetic circuit comprising a would magnetic core with a gap and a grounding device mounted on the magnetic core, the wound magnetic core comprising a plurality of stacked concentric ring layers from a radially innermost layer to a radially outermost layer of magnetic material, the magnetic field detector being positioned in the gap, wherein the grounding device comprises at least two parts of a non-magnetic material, a first part mounted against a first lateral side of the magnetic core and a second part mounted against a second lateral side of the magnetic core opposite the first lateral side, at least one of the first and second parts comprising clamp fixing extensions cooperating with the other of the first and second parts configured for clamping together the first and second parts around a portion of the magnetic core whereby free ends of clamp fixing extensions arranged on the second part are inserted through corresponding cavities of the first part and wherein at least one of the first and second parts comprises electrically conductive material, said part comprising at least one contact terminal being adapted to provide an electrical grounding connection for grounding the magnetic core to an external ground conductor, wherein the first part comprises a central passage configured to receive a primary conductor and wherein the first part is made of electrically conductive material, the first part being adapted to be more or less congruent with a surface defined by the first lateral side of the magnetic core, configured to provide a capacitive coupling between the magnetic core and the grounding device, the capacity ($C1$) between the grounding device and the magnetic core being greater than the capacity ($C2$) between the magnetic field detector and the magnetic core.

4. Electrical current transducer including a housing, a magnetic field detector device comprising a magnetic field detector, and a magnetic circuit comprising a wound magnetic core with a gap and a grounding device mounted on the magnetic core, the wound magnetic core comprising a plurality of stacked concentric ring layers from a radially innermost layer to a radially outermost layer of magnetic material, the magnetic field detector being positioned in the gap, wherein the grounding device comprises at least two parts made of a non-magnetic material, a first part mounted against a first lateral side of the magnetic core and a second part mounted against a second lateral side of the magnetic core opposite the first lateral side, at least one of the first and second parts comprising clamp fixing extensions cooperating with the other of the first and second parts configured for clamping together the first and second parts around a portion of the magnetic core whereby free ends of clamp fixing extensions arranged on the second part are inserted through corresponding cavities of the first part and wherein at least one of the first and second parts comprises electrically conductive material, said part comprising at least one contact terminal being adapted to provide an electrical grounding connection for grounding the magnetic core to an external ground conductor, wherein the first part comprises clamp extension cavities receiving there-through the free ends of clamp fixing extensions of the second part, the free ends being crimped.

5. Electrical current transducer according to claim 4, wherein the second part comprises a first element and a second element, the first and second elements comprising the clamp fixing extensions.

6. Electrical current transducer according to claim 5, wherein the first and second element each comprise a connecting portion and wherein at least two radially outer clamp fixing extensions are positioned against an outermost ring layer of the magnetic core, the connecting portion being configured to interconnect the at least two radially outer fixing extensions.

7. Electrical current transducer according to claim 5, wherein at least one of the first and second elements comprises the contact terminal.

8. Electrical current transducer according to claim 1, wherein the first part is stamped and formed from a non-magnetic sheet metal and integrally comprises a gap-positioning element bent from the sheet metal and inserted in the gap configured to determine a minimum width of the gap.

9. Electrical current transducer according to claim 8, wherein the gap-positioning element extends from a radially innermost layer to a radially outermost layer of the magnetic core.

10. Electrical current transducer according to claim 1, wherein the grounding device further comprises housing fixing portions in the form of tabs or pins interfering with corresponding wall portions formed in a housing base part of the housing configured to lock the magnetic circuit securely within the housing base part during assembly.

11. Electrical current transducer according to claim 1, wherein the first part is a single piece die stamped metal sheet part.

12. Electrical current transducer according to claim 1, wherein the second part is made of stamped metal sheet.

13. Electrical current transducer according to claim 1, wherein the space between the radially outer fixing extensions is configured to enable insertion of the magnetic field detector in the gap.

14. A method of making a magnetic circuit of an electrical current transducer, the transducer comprising a housing, a magnetic field detector device comprising a magnetic field detector, and a magnetic circuit comprising a wound magnetic core with a gap and a grounding device mounted on the magnetic core, the wound magnetic core comprising a plurality of stacked concentric ring layers from a radially innermost layer to a radially outermost layer of magnetic material, the magnetic field detector being positioned in the gap, wherein the grounding device comprises at least two separate parts made of a non-magnetic material, a first part mounted against a first lateral side of the magnetic core and a second part mounted against a second lateral side of the magnetic core opposite the first lateral side, at least one of the first and second parts comprising clamp fixing extensions cooperating with the other of the first and second parts configured for clamping together the first and second parts around a portion of the magnetic core whereby free ends of clamp fixing extensions arranged on the second part are inserted through corresponding cavities of the first part and wherein at least one of the first and second parts comprises electrically conductive material, said part comprising at least one contact terminal being adapted to provide an electrical grounding connection for grounding the magnetic core to an external ground conductor, the method including the steps of:
forming said wound magnetic core by
winding a magnetically permeable strip material to form a stacked multilayer ring core;
annealing the stacked multilayer ring core;
machining a gap through a section of the stacked multilayer ring core;
mounting the first and second parts around the wound magnetic core such that the fixing extensions of the second part are inserted through the corresponding clamp extension receiving cavities of the first part;
crimping the ends of the fixing extensions such that the two parts are clamped together tightly against opposite lateral sides of the wound magnetic core.

15. Method of making a magnetic circuit according to claim 14, wherein after the assembly of the bridging device, the magnetic circuit is heat treated for annealing the magnetic material of the wound magnetic core.

16. Electrical current transducer according to claim 3, wherein at least the first part is essentially planar configured for abutting on the first lateral side.

17. Electrical current transducer according to claim 3, wherein the first part is stamped and formed from a non-magnetic sheet metal and integrally comprises a gap-positioning element bent from the sheet metal and inserted in the gap configured to determine a minimum width of the gap.

18. Electrical current transducer according to claim 17, wherein the gap-positioned element extends from a radially innermost layer to a radially outermost layer of the magnetic core.

19. Electrical current transducer according to claim 18, wherein the grounding device further comprises housing fixing portions in the form of tabs or pins interfering with corresponding wall portions formed in a housing base part of the housing configured to lock the magnetic circuit securely within the housing base part during assembly.

20. Electrical current transducer according to claim 3, wherein the first part is a single piece die stamped metal sheet part.

21. Electrical current transducer according to claim 3, wherein the second part is made of stamped metal sheet.

22. Electrical current transducer according to claim 3, wherein the space between the radially outer fixing extensions is configured to enable insertion of the magnetic field detector in the gap.

23. Electrical current transducer according to claim 3, wherein the first part comprises clamp extension cavities receiving there-through the free ends of clamp fixing extensions of the second part, the free ends being crimped.

24. Electrical current transducer according to claim 4, wherein at least the first part is essentially planar configured for abutting on the first lateral side.

25. Electrical current transducer according to claim 4, wherein the first part is stamped and formed from a non-magnetic sheet metal and integrally comprises a gap-positioning element bent from the sheet metal and inserted in the gap configured to determine a minimum width of the gap.

26. Electrical current transducer according to claim 25, wherein the gap-positioning element extends from a radially innermost layer to a radially outermost layer of the magnetic core.

27. Electrical current transducer according to claim 4, wherein the grounding device further comprises housing fixing portions in the form of tabs or pins interfering with corresponding wall portions formed in a housing base part of the housing configured to lock the magnetic circuit securely within the housing base part during assembly.

28. Electrical current transducer according to claim 4, wherein the first part is a single piece die stamped metal sheet part.

29. Electrical current transducer according to claim 4, wherein the second part is made of stamped metal sheet.

30. Electrical current transducer according to claim 4, wherein the space between the radially outer fixing extensions is configured to enable insertion of the magnetic field detector in the gap.

* * * * *